Feb. 17, 1970 R. A. DELANEY ET AL 3,495,996

CERAMIC COMPOSITION, IMPROVED ELECTRONIC DEVICES EMPLOYING SAME, AND METHOD OF FABRICATION

Filed May 13, 1966

INVENTORS
RONALD A. DELANEY
RICHARD K. SPIELBERGER

BY Joseph L. Spiegel
ATTORNEY

United States Patent Office
3,495,996
Patented Feb. 17, 1970

3,495,996

CERAMIC COMPOSITION, IMPROVED ELECTRONIC DEVICES EMPLOYING SAME, AND METHOD OF FABRICATION

Ronald A. Delaney, Wappingers Falls, and Richard K. Spielberger, Hopewell Junction, N.Y., assignors to International Business Machines Corporation, Armonk, N.Y., a corporation of New York Filed May 13, 1966, Ser. No. 549,990
Int. Cl. C04b *35/00, 37/02;* H01b *3/00*
U.S. Cl. 106—39 6 Claims

ABSTRACT OF THE DISCLOSURE

A composition of powdered materials adapted to be dispersed in a vehicle to form a pasty substance, deposited in a thin film over an electronic device and fused thereto to form an encapsulant consists essentially of a ceramic component composed of 50–60 mol percent lead zirconate and 50–40 mol percent lead titanate and a vitreous frit component constituting 30 to 60% by weight of the composition. Using the same components but where the frit component constitutes 40–80% by weight of the composition, a composition is formed which can be used to advantage in bonding metals to ceramic. Using the same components but where the frit component constitutes 15 to 67% by weight of the composition, a composition is formed which is used to advantage as the dielectric material of a low valued microminiature capacitor.

This invention relates to ceramic compositions, and in particular to the use of such compositions as a protective material, as a dielectric substance, or as a bonding mixture in the manufacture or construction of electronic devices.

Encapsulation of electronic devices including capacitance and resistance elements, by the application of a relatively thin protective coating of material on the devices, is well known and widely practiced. Such encapsulants form a barrier over the device to thinly seal it against air, corrosive environments, moisture, etc. In general, the object of the encapsulant is to isolate the device from an environment which could cause deterioration of the device but without influencing the electrical properties thereof.

Various encapsulating compositions are known in the prior art, however their use has been attended by certain disadvantages. For example, microfissures develop in the protective coating due predominantly to the mismatch between the thermal coefficient of expansion of the coating relative to the device. This problem is particularly acute with microminiaturized capacitive and resistive devices, commonly employed in information handling systems, which are expected to maintain constant capacitive and resistive values over long periods of time despite exposure to wide temperature, humidity and other environmental variations. A typical microminiature capacitive device is disclosed in a copending application of Harold D. Kaiser entitled "High Capacitance Device," Ser. No. 370,586, filed May 27, 1964 and assigned to the same assignee as the present invention, now U.S. Patent 3,279,947 issued Oct. 18, 1966. A typical microminiature resistive device is disclosed in a copending application of Murry L. Block et al., entitled "Resistor and Method," Ser. No. 378,921, filed June 29, 1964 and assigned to the same assignee as the present invention, now U.S. Patent 3,411,947 issued Nov. 19, 1968. An overriding problem with all common electronic device encapsulants is to combine good thermal characteristics with effective protection against detrimental or corrosive environments and inertness to the underlying device.

Thus an object of the present invention is an improved encapsulant, and method of fabricating same.

Another object is an improved electronic device and method of fabricating same, the device being characterized by unexpectedly high dependability and stability, even when exposed to wide variations in ambient environment.

Still another object is improved passive devices such as capacitors and resistors having stability and dependability matching those of associated active elements such as transistors.

A further object is a reliable, low dielectric constant capacitance device.

A still further object is an improved bonding mixture.

These and other objects are accomplished in accordance with the teachings of the present invention, one illustrative embodiment of which comprises a paste composition useful in encapsulating electronic devices comprising: (1) a ceramic component composed of lead zirconate and lead titanate; (2) a vitreous frit component; and (3) a vehicle.

The ceramic component may comprise from 50–60 mol percent lead zirconate and from 50–40 mol percent lead titanate. Very satisfactory results are obtained with a composition as described above in which the ceramic component is composed of 54 mol percent lead zirconate and 46 mol percent lead titanate.

To this is added a vitreous frit component in an amount such that the frit constitutes 30–60% by weight of the solids on the composition. A preferred amount is 40%.

A vehicle is then mixed with the solids until a homogeneous paste is formed. Normally, the vehicle constitutes 25–30% by weight of the paste.

In use, the paste is applied in a thin coat to the exposed portion of an electronic device, fired at an elevated temperature to cure the coating, and then allowed to cool to room temperature.

Using the same components, but where the ceramic component comprises from 50 to 60 mol percent lead zirconate and from 50 to 40 mol percent lead titanate, and the frit component constitutes 40–80% by weight, of the solids, a mixture is formed which can be used to advantage in bonding metals to ceramic.

Using the same components, but where the ceramic component comprises from 50 to 60 mol percent lead zirconate and from 50 to 40 mol percent lead titanate, and the frit component constitutes 15 to 67% by weight, of the solids, a composition is formed which is used to advantage as the dielectric material of a low valued microminiature capacitor fabricated by slik screen techniques. The capacitors so formed exhibit very small changes in capacitance and dissipation values with wide variations in temperature, humidity or frequency.

The foregoing and other objects, features and advantages of the present invention will be apparent from the following more particular description of the preferred embodiments of the invention, as illustrated in the accompanying drawings, wherein.

Figure 1:
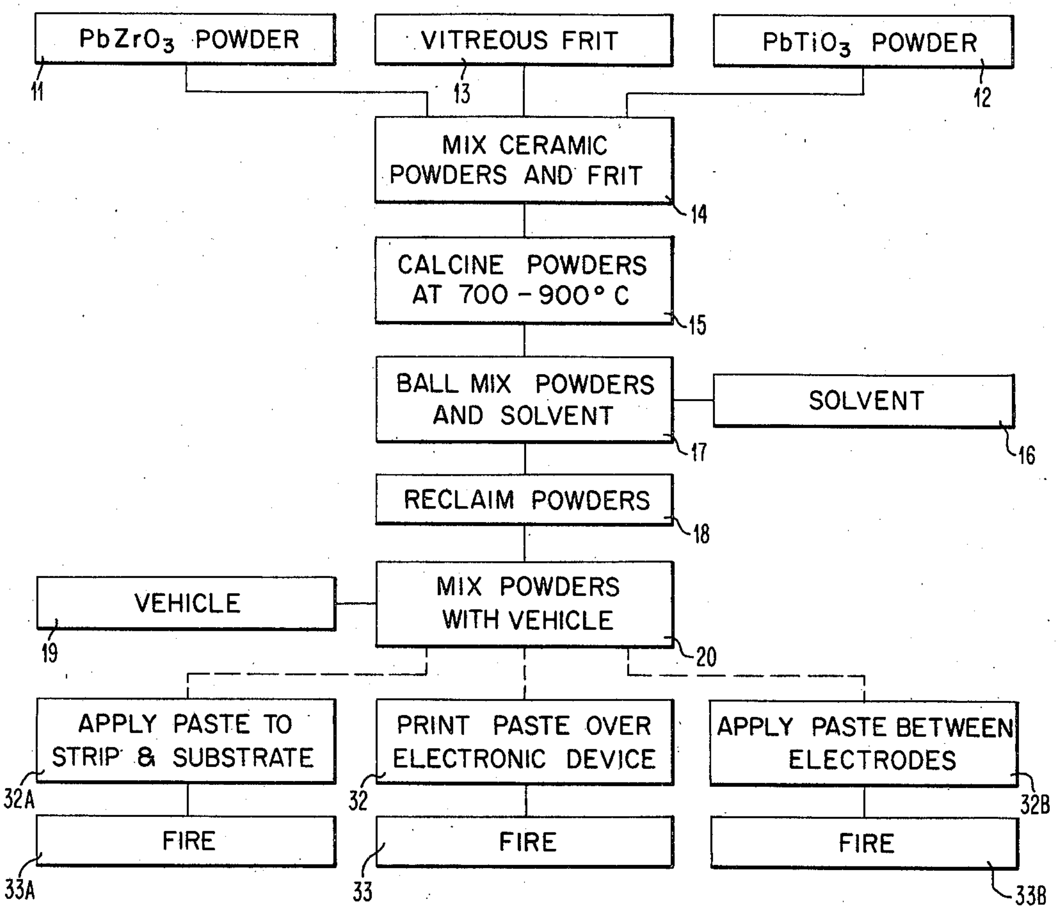
FIGURE 1 is a flow diagram of the operations performed and of the materials used in the present invention.

Referring now to the drawings, FIGURE 1 indicates the various operations performed and materials used in the present invention for fabricating encapsulated electronic devices. Quantities of high purity lead zirconate ($PbZrO_3$), lead titanate ($PbTiO_3$) and vitreous frit powders 11, 12, 13 are carefully weighed and then mixed in operation 14 by bringing them together in a suitable mixing device such as an electric mortar and pestle until the materials are uniformly dispersed.

These powders are then calcined in operation 15, at between 700 to 900° C., depending upon the glass frit used, for a suitable period of time, usually about two hours. The calcined mix is then cooled either by normal methods or by quenching. This mix is then crushed into a fine powder in an electric mortar and pestle.

The calcined powdered mix is then combined with a suitable solvent 16 such as deionized water or an organic solvent such as trichlorethylene or tetrachlorethylene and put into a non-contaminating ball mill container in operation 17. A suitable ball charge is added and the entire mix is then ball milled for a suitable time, preferably 48 to 50 hours. The solvent is then evaporated at 50–100° C. and the residual powder mix reclaimed in operation 18.

The uniformly mixed finely milled solid constituents are next combined with the vehicle 19 in operation 20, being thoroughly homogeneously mixed until a paste of the desired viscosity is formed. Standard mixing apparatus may be used such as mortar and pestle, a block type mixer or the like, to initially mix the materials. There is no need for attrition. It is then preferable, but not absolutely necessary, to further mix the ingredients on a mill, especially where large scale production is contemplated. A three roll mill is preferably used to further disperse the solid constituents. The mill temperature should not be allowed to rise much above room temperature to avoid excess volatization of the vehicle.

After removal from the mill, the paste is now ready for use in any of its areas of application: (1) as a hermetic encapsulant; (2) as a dielectric substance in a capacitance device; or (3) as a bonding mixture.

Figure 2:
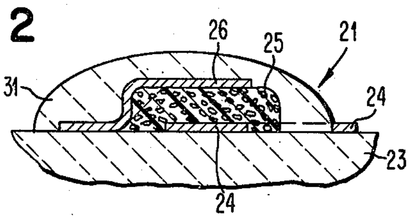
FIGURE 2 is a cross sectional view of an encapsulated capacitance device of the present invention.
Figure 3:
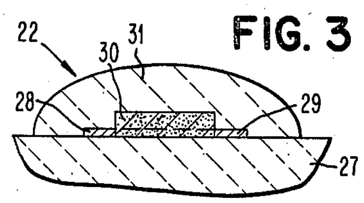
FIGURE 3 is a cross sectional view of an encapsulated resistance device of the present invention.

The first application is illustrated in FIGURE 2 with reference to encapsulation of a capacitive device 21 and in FIGURE 3 with reference to a resistor 22.

Referring in particular ot FIGURE 2, the capacitive device configuration includes a base of non-conductive material 23, such as alumina or the like, a bottom electrode 24, dielectric layer 25 and top electrode 26. The details of structure and method of fabrication are described with more detail in the above mentioned copending application of Kaiser.

Referring in particular to FIGURE 3, the resistive device configuration includes a base 27 of non-conductive material, such as alumina or the like, terminal electrodes 28, 29 and resistive layer 30 in thermal contact with the base and in electrical and thermal contact to the terminals 28, 29. The details of structure and method of fabrication are described with more detail in the above mentioned copending application of Block.

Whether it be the capacitance device 21 of FIGURE 2 or the resistor 22 of FIGURE 3, the paste is applied in a thin coat 31 to the exposed portions of the electronic device in operation 32, through a silk screen having the desired pattern.

Thereafter, in operation 33, the electronic device carrying substrate is fired to mature the coating and bond it to the device.

The composition range of the ceramic constituents is a critical requirement and must be kept within certain limits in order to practice the invention. An operable range is 50–60 mol percent lead zirconate and from 50–40 mol percent lead titanate, while a preferred percentage is 54 mol percent lead zirconate, 46 mol percent lead titanate. The reason for this would appear to be as follows. When, for example, the ceramic composition is being used as an encapsulant, the encapsulant along with the electronic device being encapsulated and the supporting substrate are in an expanded state during firing of the encapsulant. Upon cooling, each will contract. The inevitable thermal mismatch between encapsulant, electronic device and substrate has lead to cracking or fissuring of prior art encapsulants during the contraction period. However, when the ceramic composition of the present invention is used as an encapsulant, it contracts until a temperature region, typically 300–200° C., is reached during which the encapsulant quite unexpectedly begins to expand. Once having passed through this region the encapsulant again begins to contract. Upon reaching ambient temperature, the encapsulant forms a firm, durable protective coating over the electronic device.

X-ray analysis has confirmed that the final ceramic glaze composition is composed of a glassy phase, crystalline phase $PbTiO_3$ in tetragonal form, and crystalline phase $ZrO_2$ in a monoclinic form, the crystalline phases being in the ratio of 4 to 1, respectively. Moreover, as far as it can be determined, this action will only occur in the compositional ranges given above.

The vitreous frit component of the present invention is a finely divided glassy material which binds the ceramic particles together onto the underlying device. The vitreous frit should be very finely divided both to insure excellent dispersion and to prevent clogging of the screen mesh. A wide variety of glasses may be used such as the borosilicate and aluminosilicate glasses, the only limitation being that the glass shall not prevent either the lead zirconate or lead titanate from going into solution. The amount of glass frit used, however, is an important parameter and must be kept within certain limits in order to practice the invention. An operable range is for the frit to comprise 30–60% by weight, of the solid constituents with a preferred amount being 40% for a firing temperature range of 700 to 900° C. Experimentation to be described in more detail below has shown that where glass content is above 60% fissuring will occur whereas if below 30% the resulting composition will be too porous to act as an effective barrier. In either case, it has been observed that the encapsulated electronic device will fail under heavy moisture conditions.

The vehicle may be any suitable inert liquid. It would normally include a resinous binder, a solvent for the binder and a surfactant. The binder material is used to retain the powders and glass frit on the electronic device when the solvent has been removed. Examples of binders include natural gums, synthetic resins, cellulose resinous materials and the like. The solvent imparts the desired viscosity to the paste. Commonly used solvents are the higher boiling paraffins, cycloparaffins and aromatic hydrocarbons or mixtures thereof; or one or more of the mono- and di-alkyl ethers of diethylene glycol or their derivatives such as diethylene glycol monobutyl ether acetate. A suitable surfactant or dispersing agent is used to allow a better dispersion of the ceramic powders, and frit in the paste. Typical of such material are organic derivatives such as polyoxyethylene alcohol non-ionic surfactants. The elements of the vehicle are premixed into solution before mixing operation 20. The solid constituents are combined with the vehicle in a weight ratio that permits good screenability, typically 70–75% powder to 30–25% vehicle.

The firing operation 33 includes a cycle of heating, firing and cooling. The period during which the temperature of the paste on the electronic device is gradually being increased to that of the actual firing temperature is called the heating period. It is during the heating period that the solvent of the paste evaporates. The binder constituent is decomposed as the temperature increases and approaches the firing temperature and the binder is substantially removed from the paste as gaseous combustion products. The ceramic powders and frit fuse at the firing temperature to produce a durable protective coating over the electronic device. Firing may be in air at temperatures above the melting point of the frit, typically 700–900° C. Thus the firing temperature primarily depends on whether high temperature or low temperature glasses have been used, and is critical only in the sense that it is above the melting point of the frit, but below the sintering temperatures of the ceramic constituents, lead zirconate and lead titanate.

Upon cooling, as explained above, the encapsulant forms a durable protective coating over the electronic device coated.

Figure 4:
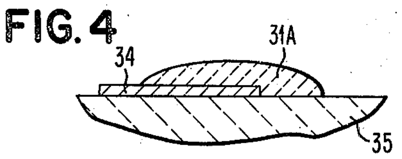
FIGURE 4 is a cross sectional view of a metal strip on a ceramic substrate overlaid with the novel composition of the present invention.
Figure 5:
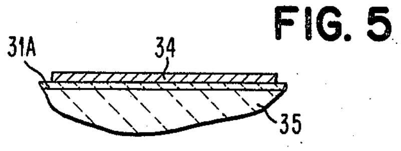
FIGURE 5 is a cross sectional view of a metal strip sealed to a ceramic substrate by means of layers of the novel composition of the present invention bonded therebetween.

FIGURES 4 and 5 illustrate use of the ceramic composition as a bonding mixture. In FIGURE 4 a metal strip 34 and ceramic substrate 35 are overlaid with a layer of the ceramic composition 31A, the composition serving to clamp metal strip 34 to substrate 35. In FIGure 5, a layer 31A of the composition is disposed between metal strip 34 and substrate 35 to form a seal therebetween. In either case, the composition is applied in a paste form to the strip and substrate in operation 32A and fired in operation 33A until a strong, elastic, hermetic bond is formed.

The percentage of frit component depends to a great extent on the particular glasses employed and their firing temperatures. For the lower firing glasses (300–500° C.) such as high lead glasses, for advantageous results the frit component constitutes 50–80% by weight, of the solids, with optimum results occurring with 60% frit content. For the higher firing glasses (500–700° C.) such as soda and borosilicate glasses, for advantageous results the frit component constitutes 40–70% by weight, of the solids with optimum results occurring with 60% frit content.

Figure 6:
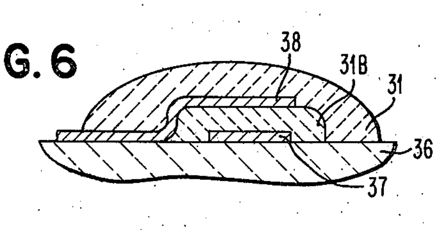
FIGURE 6 is a cross sectional view of a capacitance device employing the ceramic composition of the present invention as the dielectric.

Referring now to FIGURE 6, there is disclosed a capacitance device using the ceramic composition of the present invention as the dielectric material. The procedure for fabricating the capacitance device includes screening and firing electrode material on an insulating substrate 36 to form a bottom electrode 37. After this the dielectric layer 31B is formed. A ceramic composition obtained as described above and in which the ceramic component comprises from 50 to 60 mol percent lead zirconate and from 50 to 40 mol percent lead titanate, and the frit component typically constitutes 15 to 67% by weight, of the solids in accordance with Lichtenecker's Rule,, is applied in paste form over the bottom electrode in operation 32B. The paste is then dried at 150° C. for approximately 15 minutes after which a second layer of the paste is screened onto the first layer and the combination is allowed to set for one-half hour and then further dried at 150° C. for approximately 15 minutes. The composition is then fired in air for approximately one hour at a temperature compatible with the glass frit used, after which it is removed from the furnace and quenched by placing on a large aluminum block. The top electrode 38 is then formed using standard screening techniques to complete formation of a low dielectric constant capacitor.

Where the frit component of the ceramic composition was outside the 30–60% by weight, range, it was found advisable, as discussed in more detail below, to encapsulate the device as was done with the capacitor of FIGURE 2 to form layer 31 thereover.

It is believed that the present invention will be more fully appreciated in the light of the following detailed series of examples.

SERIES 1

Quantities of commercially available, high purity lead zirconate and lead titanate were mixed in a 54 mol percent lead zirconate, 46 mol percent lead titanate ratio. The ceramic component was then divided and one portion placed in a non-contaminating container with a borosilicate glass frit constituting 33% by weight of the solids, while another portion placed in a non-contaminating container with borosilicate glass frit constituting 50% by weight of the solid.

Each solid mixture was then combined with a vehicle, in this case ethyl cellulose and beta terpineol, such that the vehicle constituted 25% by weight of the total, and thoroughly homogeneously mixed for 2 hours until a paste of the desired viscosity was formed.

Thirty ceramic substrates, each measuring approximately 0.5 x 0.5 inch and having a thickness of approximately 0.06 inch were selected. Two capacitors were printed on each substrate in accordance with the method disclosed in the above mentioned copending application of Kaiser. One third of the capacitors were coated with the 33% glass encapsulant, one third with the 50% glass encapsulant and one third were left uncoated. The substrates were then heated in air at 750° C. for one hour to cure the coatings and then allowed to cool.

The initial average capacitance and dissipation at 1000 cycles and resistance at 10 volts DC were calculated and are recorded in the following Table I.

TABLE I

| Capacitor type | Capacitance (Pf) | Dissipation factor | Resistance (10'' Ω) |
|---|---|---|---|
| Uncoated | 340-400 | .011-.012 | 12-15 |
| 33% frit | 500-560 | .014-.016 | 13-20 |
| 50% frit | 440-500 | .014-.015 | 17-20 |

All the modules were then placed in a controlled environment of 95° C. and 100% relative humidity (saturation).

After only ninety-eight hours all the uncoated capacitors catastrophically failed, that is, shorted out completely.

After 260 hours two of the 33% frit coated capacitors had resistance of $10^9$ ohms and a dissipation factor of 0.1. One of the 50% frit coated capacitors had a resistance of approximately $10^{10}$ ohms and a dissipation factor of 0.07. The average capacitance dissipation factor at 1000 cycles and resistance at 10 volts DC after 260 hours are given in the following Table II.

TABLE II

| Capacitor Type | Capacitance (Pf) | Dissipation factor | Resistance (10'' Ω) |
|---|---|---|---|
| 33% frit | 400-540 | .014-.017 | 4-24 |
| 50% frit | 410-450 | .015-.016 | 3-24 |

SERIES 2

Several ceramic substrates of the type used in the first series of examples were selected. Resistors were printed on each substrate, one-half having a resistivity of 3000 ohms/sq., one-half 1000 ohms/sq. Half of each type were then coated with the encapsulant of the present invention. The encapsulant ceramic component was 54 mol percent lead zirconate, 46 mol percent lead titanate. Borosilicate glass was used as the glass frit and constituted 40% of the solids, by weight. The encapsulant was applied in paste form, and fired in air at 750° C. for one hour. Substrates of each type were then evaluated for thermal coefficient resistivity (TCR) under ambient environmental conditions. A comparison was made between the TCR's of the coated and uncoated resistors. Modules of each type were placed on THL test at 70° C. and 100% relative humidity for sixteen hours. Another comparison of resistance changes was made between the coated and uncoated resistors. Finally, substrates of each type were placed on TL test at 300° C. in a dry atmosphere for 32 hours, and the resistance changes compared. In each case the marked superiority of the encapsulated resistors was apparent from the average results recorded in the following Table III.

TABLE III

| Register type | TCR Ambient RH percent | ΔR 100% RH 70° C., 16 hr., percent | ΔR 0 RH 300° C., 32 hr., percent |
|---|---|---|---|
| 3K uncoated | −1.19 | +3.86 | +1.56 |
| 3K coated | −0.36 | +0.53 | +1.16 |
| 1K uncoated | −4.9 | +8.1 | −6.7 |
| 1K coated | −2.16 | +0.27 | +0.86 |

SERIES 3

Capacitance devices were fabricated using the ceramic composition. Fifty ceramic substrates were selected. Platinum-Gold electrode material was screened and fired on the ceramic substrate to form a bottom electrode after the first layer of the ceramic composition of the present invention was screened over the bottom electrode, fired at 1000° C. for ten to fifteen minutes and cooled. A second layer was screened over the first layer and dried at 150° C. for fifteen to twenty minutes. The top electrode was then screened over this and dried. Then the entire device was fired in air at 1000° C. for one hour and cooled to complete the devices.

In each instance the ceramic inner dielectric component comprised 54 mol percent lead zirconate and 46 mol percent lead titanate. In each case a borosilicate glass frit was used. In one-fifth of the cases the frit constituted 15% by weight, of the solids; in another one-fifth, 25%, in another 33%, in another 50%, and in a final fifth 67%.

The average dielectric constant and dissipation factor at 1kc.p.s. for these devices were calculated and given in the following Table IV.

TABLE IV

| Capacitor type | Dielectric constant Ke | Dissipation factor |
|---|---|---|
| 15% frit | 55 | .0230 |
| 25% frit | 30 | .0050 |
| 33% frit | 20 | .0023 |
| 50% frit | 15 | .0016 |
| 67% frit | 10 | .0012 |

The following points should be mentioned here. First, the dielectric constant follows the usual logarithmic mixing rule of Lichtenecker. Secondly, the 25% and 33% frit capacitance devices were further evaluated for temperature and frequency response and were noted to change less than 5% in capacitance value and dissipation factor for either temperature change of 0–100° C. or frequency change of 1000 cycles to 100 megacycles. Their DC resistance fell off less than 1/20 of their original value in the same 0 to 100° C. testing. These characteristics were calculated and are given in the following Tables V and VI.

It should also be noted that the 15%, 25% and 67% frit devices failed after a relatively short period of time due to porosity in the case of the 15% and 25% frit devices, and cracking in the case of the 67% frit devices. When these devices were encapsulated with the ceramic composition of the present invention having a 40%, by weight, of solids frit content, no failures were observed and their characteristics were in every respect comparable to their characteristics when evaluated without the encapsulant as given in Tables IV, V and VI.

Thus the ceramic composition of the present invention, while useful as a low valued dielectric material when having a frit content of 15%–67%, can only be used as an encapsulant when the frit content is held between 30–60%.

What is claimed is:

1. A method for manufacturing an electronic device in a protected form including:
partially coating said device with a paste composition consisting essentially of,
a ceramic component composed of 50–60 mol percent zirconate and 50–40 mol percent lead titanate, a silicate frit component having a melting point below the sintering temperature of said ceramic component, said frit component constituting 30–60% by weight, of said solids and an inert vehicle constituting 30–25% by weight, of said paste composition;
firing said device above the softening point of said frit but below the sintering temperature of said ceramic component; and
cooling said device to room temperature.

2. A composition of powdered materials adapted to be dispersed in a vehicle to form a pasty substance, deposited in a thin film over an electronic device and fused thereto to form an encapsulant, said composition consisting essentially of:
a ceramic component composed of 50–60 mol percent lead zirconate and 50–40 mol percent lead titanate; and
a silicate frit component having a melting point below the sintering temperature of said ceramic component, said frit component constituting 30 to 60% by weight of said composition.

3. The composition according to claim 2 wherein said ceramic component is composed of approximately 54 mol percent lead zirconate and 46 mol percent lead titanate, and said vitreous frit component constitutes approximately 40% by weight, of said composition.

4. A composition of powdered materials adapted to be dispersed in a vehicle to form a pasty substance useful as a bonding material between metals and ceramic, said composition consisting essentially of:
a ceramic component composed of 50–60 mol percent lead zirconate and 50–40 mol percent lead titanate; and

TABLE V

| Capacitor type | Parameter | Temperature (° C.) 0 | 25 | 50 | 75 | 100 |
|---|---|---|---|---|---|---|
| 33% frit | Cap (pf/in.$^2$) | 2,100 | 2,150 | 2,210 | 2,250 | 2,270 |
| | Dissipation factor | .012 | .013 | .015 | .018 | .021 |
| | Resistance ($10^{12}$ Ω) | 50 | 35 | 15 | 10 | 2 |
| 50% frit | Cap (pf/in.$^2$) | 890 | 910 | 950 | 960 | 970 |
| | Dissipation factor | .006 | .007 | .008 | .010 | .012 |
| | Resistance $10^{12}$ Ω) | 50 | 35 | 15 | 10 | 2 |

TABLE VI.—FREQUENCY RESPONSE AT 250° C.

| Capacitor type | Parameter | Frequency (c.p.s.) 1 kc. | 10 kc. | 100 kc. | 1 mc. | 100 mc. |
|---|---|---|---|---|---|---|
| 33% frit | Cap (pf/in.$^2$) | 2,100 | 2,000 | 1,950 | 1,900 | 1,900 |
| | Dissipation factor | .019 | .019 | .019 | .019 | .019 |
| 50% frit | Cap (pf/in.$^2$) | 900 | 890 | 860 | 850 | 850 |
| | Dissipation factor | .010 | .010 | .010 | .010 | .010 |

a silicate frit component, said frit component constituting 40–80% by weight of said composition.

5. The composition according to claim 4 wherein said ceramic component is composed of approximately 54 mol percent lead zirconate and 46 mol percent lead titanate, and said vitreous frit component constitutes approximately 60% by weight, of said composition.

6. A composition of powdered materials adapted to be dispersed in a vehicle to form a pasty substance useful as the dielectric material of a low valued capacitor, said composition consisting essentially of:

a ceramic component composed of 50–60 mol percent lead zirconate and 50–40 mol percent lead titanate; and a silicate frit component having a melting point below the sintering temperature of said ceramic component, said frit component constituting 15 to 67% by weight of said composition.

References Cited

UNITED STATES PATENTS

| | | | |
|---|---|---|---|
| 3,405,002 | 10/1968 | Martin | 106—49 XR |
| 2,538,554 | 1/1951 | Cherry | 252—62.9 XR |
| 2,708,244 | 5/1955 | Jaffe | 252—62.9 XR |
| 2,920,971 | 1/1960 | Stookey | 106—53 XR |
| 2,956,219 | 10/1960 | Cianchi. | |
| 3,000,745 | 9/1961 | Cianchi. | |
| 3,195,030 | 7/1965 | Herczog et al. | 317—258 |
| 3,277,354 | 10/1966 | Ikeda et al. | 317—258 |
| 3,279,947 | 10/1966 | Kaiser | 106—39 XR |
| 3,293,077 | 12/1966 | Kaiser et al. | |

HELEN M. McCARTHY, Primary Examiner

U.S. Cl. X.R.

106—49, 53; 117—125, 129; 317—234, 258